United States Patent
Li et al.

(10) Patent No.: US 9,000,411 B2
(45) Date of Patent: Apr. 7, 2015

(54) MEMRISTOR DEVICES CONFIGURED TO CONTROL BUBBLE FORMATION

(75) Inventors: Zhiyong Li, Redwood City, CA (US); Alexandre M. Bratkovski, Mountain View, CA (US); Jianhua Yang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 612 days.

(21) Appl. No.: 13/130,799

(22) PCT Filed: Jan. 6, 2009

(86) PCT No.: PCT/US2009/000070
§ 371 (c)(1),
(2), (4) Date: May 24, 2011

(87) PCT Pub. No.: WO2010/080079
PCT Pub. Date: Jul. 15, 2010

(65) Prior Publication Data
US 2011/0227031 A1    Sep. 22, 2011

(51) Int. Cl.
*H01L 45/00* (2006.01)
*H01L 27/24* (2006.01)
*H01L 29/06* (2006.01)
*G11C 11/00* (2006.01)
*B82Y 10/00* (2011.01)

(52) U.S. Cl.
CPC ............. *H01L 29/0665* (2013.01); *B82Y 10/00* (2013.01); *H01L 29/0673* (2013.01); *H01L 29/068* (2013.01); *H01L 27/2472* (2013.01); *H01L 45/08* (2013.01);
(Continued)

(58) Field of Classification Search
CPC ....... H01L 45/146; H01L 45/12; H01L 45/04; H01L 45/1233; H01L 45/1675; H01L 45/08; H01L 45/085; H01L 45/1266; H01L 45/141; H01L 45/142; H01L 45/143; H01L 45/144; H01L 45/147; H01L 45/1641; H01L 27/2436; H01L 27/2454; H01L 27/2463; H01L 27/2472
USPC ......... 257/536, 5, 2, 530, 529, 614, 295, 421, 257/194, E29.166, E29.323, E45.001, 257/E45.002, E45.003, E27.004, E21.003, 257/E28.001; 438/382, 381, 385, 104; 365/148, 51, 63, 151, 161, 163, 158, 365/171, 175
See application file for complete search history.

(56) References Cited

U.S. PATENT DOCUMENTS 7,060,586 B2    6/2006   Li
7,126,152 B2 *  10/2006  Ishida et al. .................... 257/30
(Continued)

FOREIGN PATENT DOCUMENTS

WO    WO 2010014064 A1 *  2/2010  ............ H01L 29/861

OTHER PUBLICATIONS

International Search Report, Aug. 27, 2009. PCT Patent Application No. PCT/US2009/000070.

*Primary Examiner* — Chuong A Luu
*Assistant Examiner* — Moazzam Hossain
(74) *Attorney, Agent, or Firm* — Hewlett-Packard Patent Department

(57) ABSTRACT

Various embodiments of the present invention are direct to nanoscale, reconfigurable, two-terminal memristor devices. In one aspect, a device (400) includes an active region (402) for controlling the flow of charge carriers between a first electrode (104) and a second electrode (106). The active region is disposed between the first electrode and the second electrode and includes a storage material. Excess mobile oxygen ions formed within the active region are stored in the storage material by applying a first voltage.

17 Claims, 8 Drawing Sheets

(52) U.S. Cl.
CPC ......... *H01L 45/1233* (2013.01); *H01L 45/146* (2013.01); *H01L 45/147* (2013.01)

(56) References Cited

U.S. PATENT DOCUMENTS

| | | | |
|---|---|---|---|
| 7,298,017 | B1 | 11/2007 | Liu |
| 7,426,128 | B2 * | 9/2008 | Scheuerlein ................... 365/63 |
| 2005/0121697 | A1 * | 6/2005 | Ishida et al. ................... 257/200 |
| 2005/0237834 | A1 * | 10/2005 | Bozano et al. ................ 365/203 |
| 2008/0001172 | A1 * | 1/2008 | Karg et al. ..................... 257/194 |
| 2008/0078985 | A1 * | 4/2008 | Meyer et al. ...................... 257/6 |
| 2008/0239797 | A1 | 10/2008 | Tsukamoto |
| 2009/0108202 | A1 * | 4/2009 | Gritz et al. ................. 250/338.1 |
| 2009/0272958 | A1 * | 11/2009 | Ufert et al. ......................... 257/2 |
| 2010/0038791 | A1 * | 2/2010 | Lee et al. ....................... 257/758 |
| 2011/0228593 | A1 * | 9/2011 | Strukov ....................... 365/148 |

* cited by examiner

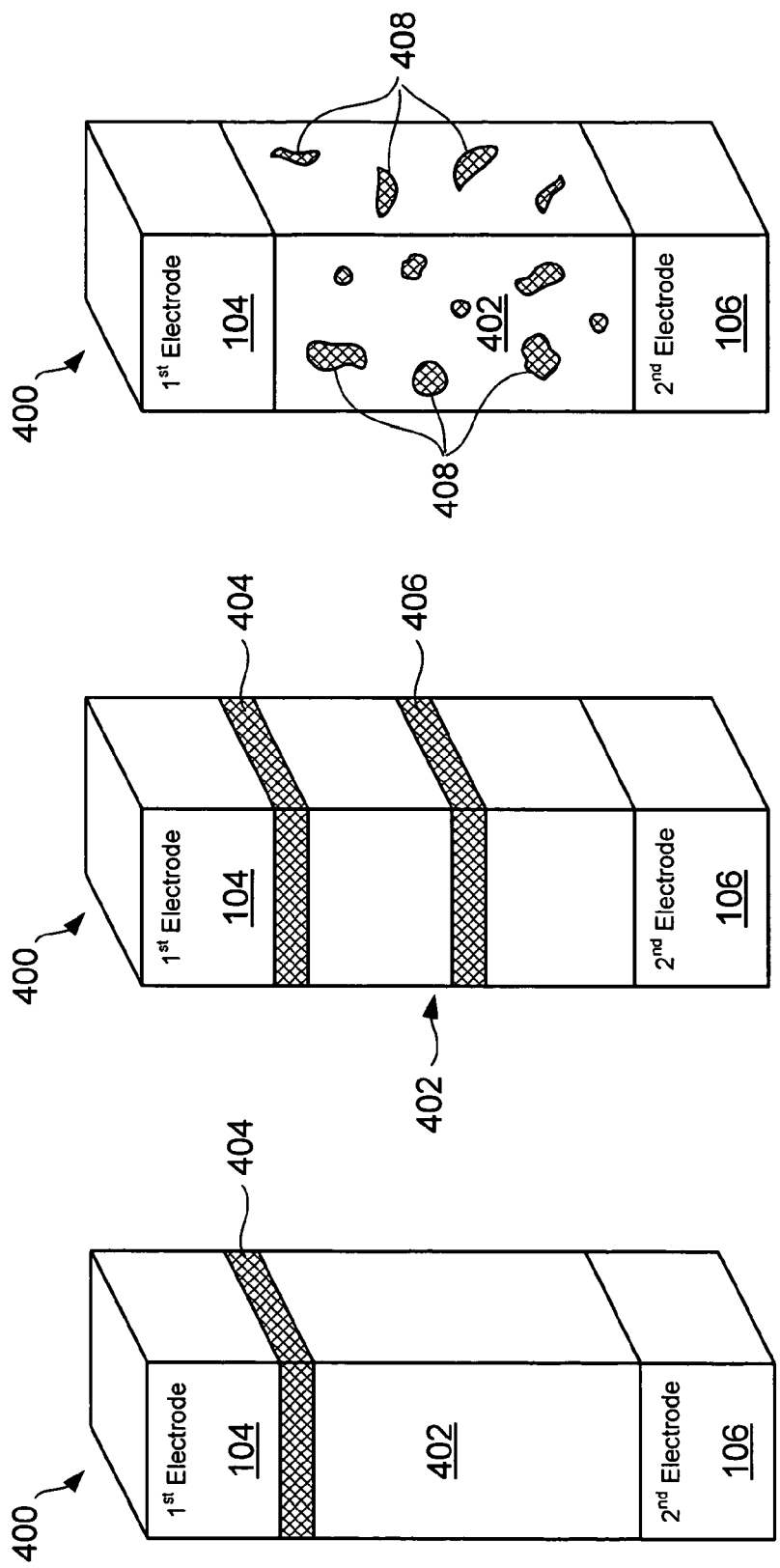

MEMRISTOR DEVICES CONFIGURED TO CONTROL BUBBLE FORMATION

TECHNICAL FIELD

Embodiments of the present invention are related to nanoscale memristor devices, and, in particular, to re-configurable memristors.

BACKGROUND

Significant research and development efforts are currently directed towards designing and manufacturing nanoscale electronic devices, such as nanoscale memories. Nanoscale electronics promises significant advances, including significantly reduced features sizes and the potential for self-assembly and for other relatively inexpensive, non-photolithography-based fabrication methods. However, the design and manufacture of nanoscale electronic devices present many new problems compared with the current state-of-the-art.

Studies of switching in nanometer-scale transition-metal devices have previously reported that these devices could be reversibly switched and had an "on-to-off" conductance ratio of ~$10^3$. These devices have been used to construct crossbar circuits and provide a promising route for the creation of ultra-high density non-volatile memory. A series connection of crossbar switches that can be used to fabricate, for example, latch circuit elements has also been demonstrated, which is an important component for logic circuits and for communication between logic and memory. New logic families that can be constructed entirely from crossbar arrays of resistive switches or as hybrid structures composed of resistive switches and transistors have been described. These new logic families have the potential to dramatically increase the computing efficiency of CMOS circuits, thereby enabling performance improvements of orders of magnitude without having to shrink transistors, or to even replace CMOS for some applications if necessary. However, it is desired to improve the performance of the devices that are presently fabricated.

BRIEF DESCRIPTION OF THE DRAWINGS

FIGS. 4A-4C show three ways in which an oxygen storage material can be incorporated into an active region of a memristor device in accordance with embodiments of the present invention.

DETAILED DESCRIPTION

Various embodiments of the present invention are directed to nanoscale, two-terminal, electronic devices, which are nonvolatile and combine reconfigurable diode rectifying states with memristive switching. A memristor device configured in accordance with embodiments of the present invention is composed of an oxide-based active region sandwiched between two electrodes. The two interfaces between the active region and the electrodes are Schottky contacts. The active region is a diode that can be switched into one of four different rectifying states by applying an electrical field of an appropriate magnitude and polarity across the active region. The electric field changes the electrostatic potential distribution near the interfaces to have Ohmic-like barriers and/or Schottky-like barriers, thus enabling the active region to be re-configured so the device can operate as one of the following four types of rectifiers: a forward rectifier, a reverse rectifier, a shunted rectifier, and a head-to-head rectifier. The active region remains in a particular rectifying state provided operating voltages applied to the device do not exceed the magnitude of the electric field used to switch the rectifying state of the active region.

However, during formation of the oxide active region, oxygen bubbles can form which can deform the device or cause the release of oxygen from the active region depleting the active region of oxygen which shortens the lifetime of the device. Thus, embodiments of the present invention include an oxygen storage material incorporated into the active region in order to store oxygen formed in the active region to prevent deformation and extend the life of the device.

The detailed description is organized as follows: A description of two-terminal electronically actuated devices is provided in a first subsection. A description of switching the rectifying state of the devices is provided in a second subsection. Various materials that can be used to fabricate the devices are provided in a third subsection. An example implementation of the devices in crossbar arrays is provided in a fourth subsection. Simulation results for operating the device are provided in a fifth subsection.

I. A Two-Terminal Electronically Actuated Device

Figure 1A:
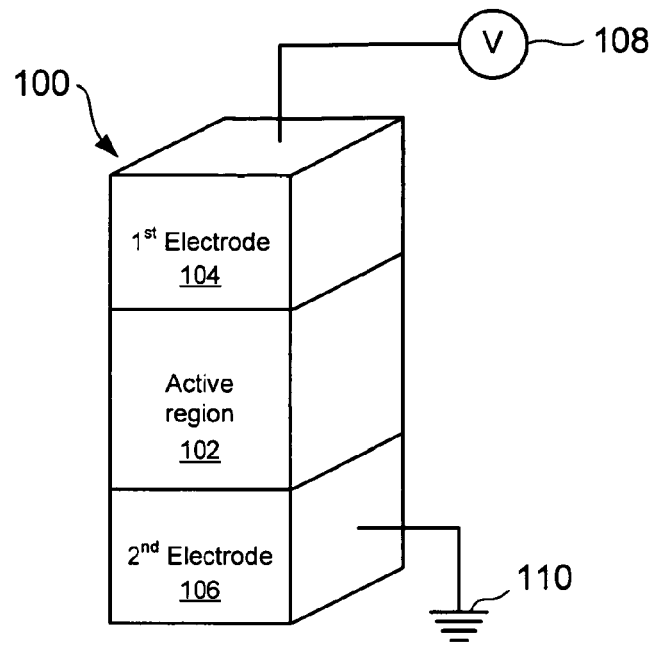
FIG. 1A shows a two-terminal memristor device configured in accordance with embodiments of the present invention.

FIG. 1A shows a two-terminal device 100 configured in accordance with embodiments of the present invention. The device 100 is composed of three layers: an active region 102 sandwiched between a first electrode 104 and a second electrode 106. The first electrode 104 is connected to a voltage source 108 and the second electrode is connected to a ground 110. The active region 102 is a diode that includes a dopant. Applying an electric field of an appropriate magnitude and polarity changes the position of the dopant. As a result, the active region 102 can be operated as one of the four different types of rectifiers: a forward rectifier, a reverse rectifier, a head-to-head rectifier, and a shunted rectifier.

Figure 1B:
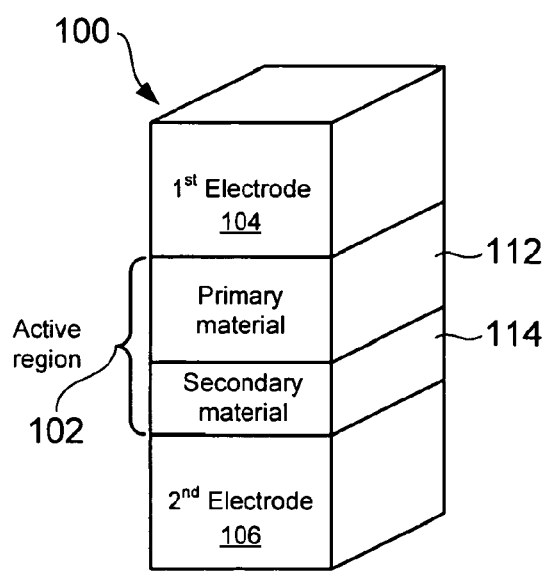
FIG. 1B shows primary and secondary active material layers in an active region of a memristor device configured in accordance with embodiments of the present invention.

FIG. 1B shows the active region 102 is composed of a primary active region 112, or layer, and a secondary active region, or layer 114 in accordance with embodiments of the present invention. The primary active region 112 comprises a thin film of a material that is electronically semiconducting or nominally electronically insulating and can also be a weak ionic conductor. The primary active material is capable of transporting and hosting ions that act as dopants in order to control the flow of electrons or current through the device 100. On the other hand, the secondary active material comprising the secondary active region 114 typically comprises a film within the active region that is a source of dopants for the primary active material. These dopants may be impurity atoms such as hydrogen or some other cation, such as alkali or transition metals, that act as electron donors for the primary active material. Alternatively, the dopants can be anion vacancies, which in the primary active material are charged and therefore are also electron donors for the lattice of the active region 102. It is also possible to drive the anions into the primary active material, which become electron acceptors or hole donors.

The basic mode of operation is to apply an electrical field of an appropriate magnitude and polarity across the active region 102. When the magnitude and polarity of the electrical field, also called a "drift field," exceeds a threshold enabling the dopants to become mobile in the primary active material, the dopants can drift into or out of the primary active material via ionic transport from the secondary material. The ionic species are specifically chosen from those that act as electrical dopants for the primary active material, and thereby change the resistance of the primary active material. For example, applying a drift field that introduces dopants from the secondary active material into the primary active material lowers the resistance of the primary active material, while applying a drift field that drives dopants from the primary active material into the secondary active material increases the resistance of the primary active material. In addition, the primary active material and the dopants are chosen such that the drift of the dopants into or out of the primary active material is possible but not too facile that dopants can diffuse into or out of the primary active material when no voltage is applied, in order to ensure that the active region 102 remains in a particular rectifying state for a reasonable period of time, perhaps for many years at room temperature. This ensures that the active region 102 is nonvolatile. In other words, the active region 102 is memristive because the active region 102 retains its rectifying state even after the drift field has been removed. Applying a drift field with a large enough magnitude causes both electron current and dopants to drift, whereas applying operating voltages with lower relative voltage magnitudes than the drift field causes negligible dopant drift enabling the device to retain its rectifying state during operation.

The term "memristor" is short for "memory resistor." Memristors are a class of passive two-terminal circuit elements that maintain a functional relationship between the time integrals of current and voltage. This results in resistance varying according to the device's memristance function. Specifically engineered memristors provide controllable resistance useful for switching current. The memristor is a special case in so-called "memristive systems," described as a class of mathematical models useful for certain empirically observed phenomena, such as the firing of neurons. The definition of the memristor is based solely on fundamental circuit variables, similar to the resistor, capacitor, and inductor. Unlike those more familiar elements, the necessarily nonlinear memristors may be described by any of a variety of time-varying functions. As a result, memristors do not belong to Linear Time-Independent circuit models. A linear time-independent memristor is simply a conventional resistor.

A memristor is a two-terminal element in which the 'magnetic flux' (defined as an integral of bias voltage over time) $\Phi_m$ between the terminals is a function of the amount of electric charge q that has passed through the device. Each memristor is characterized by its memristance function describing the charge-dependent rate of change of flux with charge as follows:

$$M(q) = \frac{d\Phi_m}{dq}$$

Based on Faraday's law of induction that magnetic flux $\Phi_m$ is the time integral of voltage, and charge q is the time integral of current, the memristance can be written as $$M(q) = \frac{V}{I}$$

Thus, the memristance is simply charge-dependent resistance. When M(q) is constant, the memristance reduces to Ohm's Law R=V/I. When M(q) is not constant, the equation is not equivalent to Ohm's Law because q and M(q) can vary with time. Solving for voltage as a function of time gives:

$$V(t) = M[q(t)]I(t)$$

This equation reveals that memristance defines a linear relationship between current and voltage, as long as charge does not vary. However, nonzero current implies instantaneously varying charge. Alternating current may reveal the linear dependence in circuit operation by inducing a measurable voltage without net charge movement, as long as the maximum change in q does not cause change in M. Furthermore, the memristor is static when no current is applied. When I(t) and V(t) are 0, M(t) is constant. This is the essence of the memory effect.

The primary active material can be nanocrystalline, nanoporous, or amorphous. The mobility of the dopants in such nanostructured materials is much higher than in bulk crystalline material, since drift can occur through grain boundaries, pores or through local structural imperfections in a nanocrystalline, nanoporous, or amorphous material. Also, because the primary active material is relatively thin, the amount of time needed for dopants to drift into or out of the primary active material enables the primary active materials conductivety to be rapidly changed. For example, the time needed for a drift process varies as the square of the distance covered, so the time to drift one nanometer is one-millionth the time to drift one micrometer.

The primary active and secondary active materials of the active region 102 are contacted on either side by metal electrodes 104 and 106, or one of the electrodes can be composed of a semiconductor material and the other a metal. When the active region 102 is composed of a semiconductor material, the contract between a metal electrode and the active region 102 depletes the active region 102 of free charge carriers. Thus, the net charge of the active region 102 depends on the identity of the dopant which is positive in the case of electron donors and negative in the case of electron acceptors.

The ability of the dopant to drift in and out of the primary active material is substantially improved if one of the interfaces connecting the active region 102 to a metal or semiconductor electrode is non-covalently bonded. Such an interface may be caused by a void in the material or it may be the result of an interface that contains a material that does not form covalent bonds with the electrode, the primary active material, or both. This non-covalently bonded interface lowers the activation energy of the atomic rearrangements that are needed for drift of the dopants in the primary active material. This interface is essentially an extremely thin insulator, and adds very little to the total series resistance of the device.

One potentially useful property of the primary active material is that it can be a weak ionic conductor. The definition of a weak ionic conductor depends on the application for which the device 100 is designed. The mobility $\mu_d$ and the diffusion constant D for a dopant in a lattice are related by the Einstein equation:

$$D=\mu_d kT$$

where k is Boltzmann's constant, and T is absolute temperature. Thus, if the mobility $\mu_d$ of a dopant in a lattice is high so is the diffusion constant D. In general, it is desired for the active region 102 of the device 100 to maintain a particular rectifying state for an amount of time that may range from a fraction of a second to years, depending on the application. Thus, it is desired that the diffusion constant D be low enough to ensure a desired level of stability, in order to avoid inadvertently turning the active region 102 from one rectifier to another rectifier via ionized dopant diffusion, rather than by intentionally setting the state of the active region 102 with an appropriate voltage. Therefore, a weakly ionic conductor is one in which the dopant mobility $\mu_d$ and the diffusion constant D are small enough to ensure the stability or non-volatility of the active region 102 for as long as necessary under the desired conditions. On the other hand, strongly ionic conductors would have relatively larger dopant mobilities and be unstable against diffusion.

II. Non-Volatile Memristive Switching of the Device

In certain embodiments, the active region 102 can be operated so that Ohmic and Schottky barriers are created to control the flow of charge carriers through the active region 102. However, the traditional description of electrode/semiconductor Schottky and Ohmic barriers does not apply to a nanoscale device 100 because the materials comprising the electrodes 104 and 106 and the active region 102 are structured at the nanoscale. As a result, the structural and electronic properties are not averaged over the large distances for which the theory of metal-semiconductor contacts have been developed. Instead, the electronic properties of undoped electrode/active region interfaces can electronically resemble Schottky barriers and are called "Schottky-like barriers," and the electronic properties of doped electrode/semiconductor interfaces electronically resemble Ohmic barriers and are called "Ohmic-like barriers."

Figure 2A:
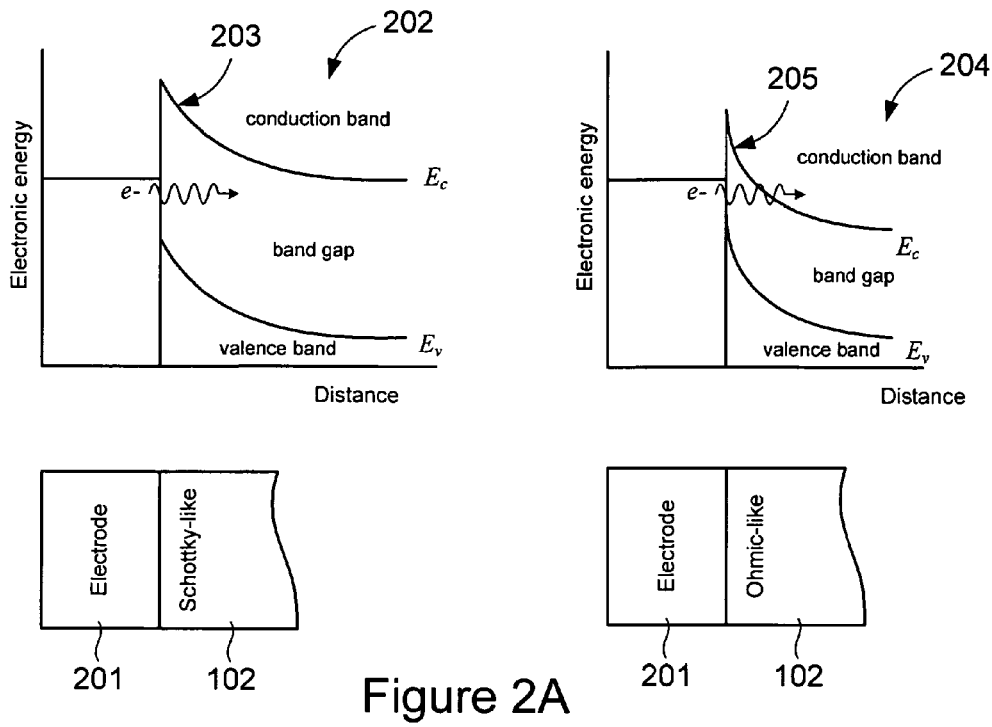
FIG. 2A shows electronic band diagrams representing electronic properties of Schottky-like and Ohmic-like barriers at an electrode and active region interface in accordance with embodiments of the present invention.

Conduction of electrons through the active region 102 occurs via quantum mechanical tunneling through the Ohmic-like barrier. FIG. 2A shows electronic band diagrams that represent the electronic properties of Schottky-like and Ohmic-like barriers at an electrode 201/active region 102 interface in accordance with embodiments of the present invention. As shown in band diagram 202, when the active region 102 near an electrode 201 has a low dopant concentration or is essentially intrinsic, the tunneling barrier is a Schottky-like barrier 203, which can be characterized as high and wide and electrons cannot tunnel into the conduction band of the active region 102. Thus, the conductivity through the active region 102 is low and the device 100 is in the "off" state. On the other hand, as shown in band diagram 204, when a sufficient number of dopants have been moved into the active region 102 near one of the electrodes 201, the tunneling barrier is an Ohmic-like barrier 205 and the width and perhaps the height of the tunneling barrier are diminished, electrons tunnel into the conduction band of the active region 102, which results in an increase in the conductivity, and the device 100 is in the "on" state.

Figure 2B:
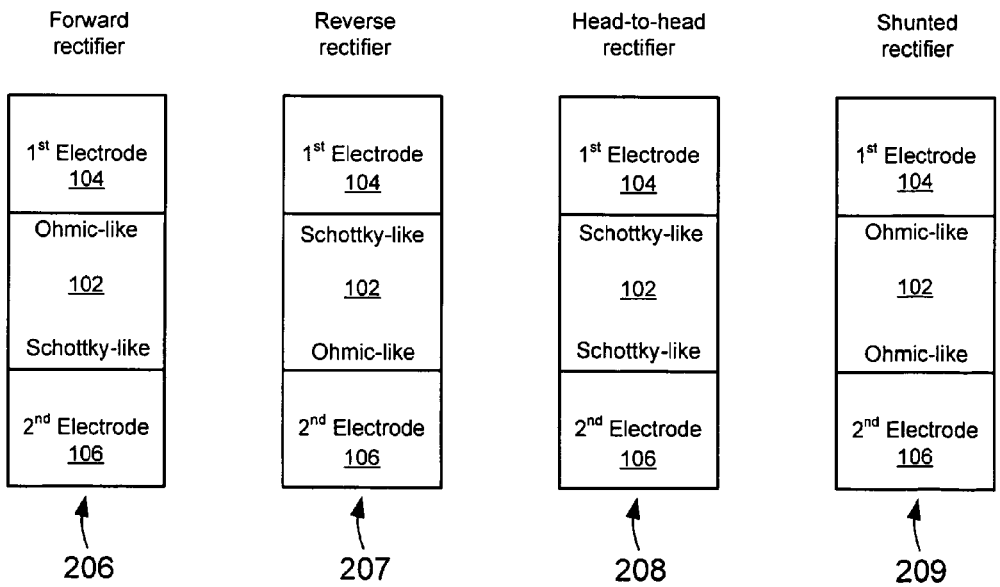
FIG. 2B shows profiles of tunneling barriers associated with four rectifiers configured in accordance with embodiments of the present invention.

Each of the four rectifiers corresponds to a different dopant distribution. When the dopant is located at or near an electrode/active region interface, the interface has an Ohmic-like barrier. Thus, charge carriers can readily tunnel through the Ohmic-like barrier into and out of the active region 102. On the other hand, an undoped portion of the active region 102 at or near an electrode/active region interface has a Schottky-like barrier that is either too high or wide to permit most charge carriers from tunneling through the active region 102. FIG. 2B shows the relative locations of the Ohmic-like and Schottky-like barriers associated with each of the four rectifiers in accordance with embodiments of the present invention. A forward rectifier 206 and a reverse rectifier 207 have Ohmic-like barriers and Schottky-like barriers located at opposite interfaces. A head-to-head rectifier 208 is characterized by having the dopants distributed within the active region 102 leaving Schottky-like barriers at both interfaces. On the other hand, a shunted rectifier 209 is characterized by having dopants located at or near both interfaces creating Ohmic-like barriers at both interfaces.

Figure 2C:
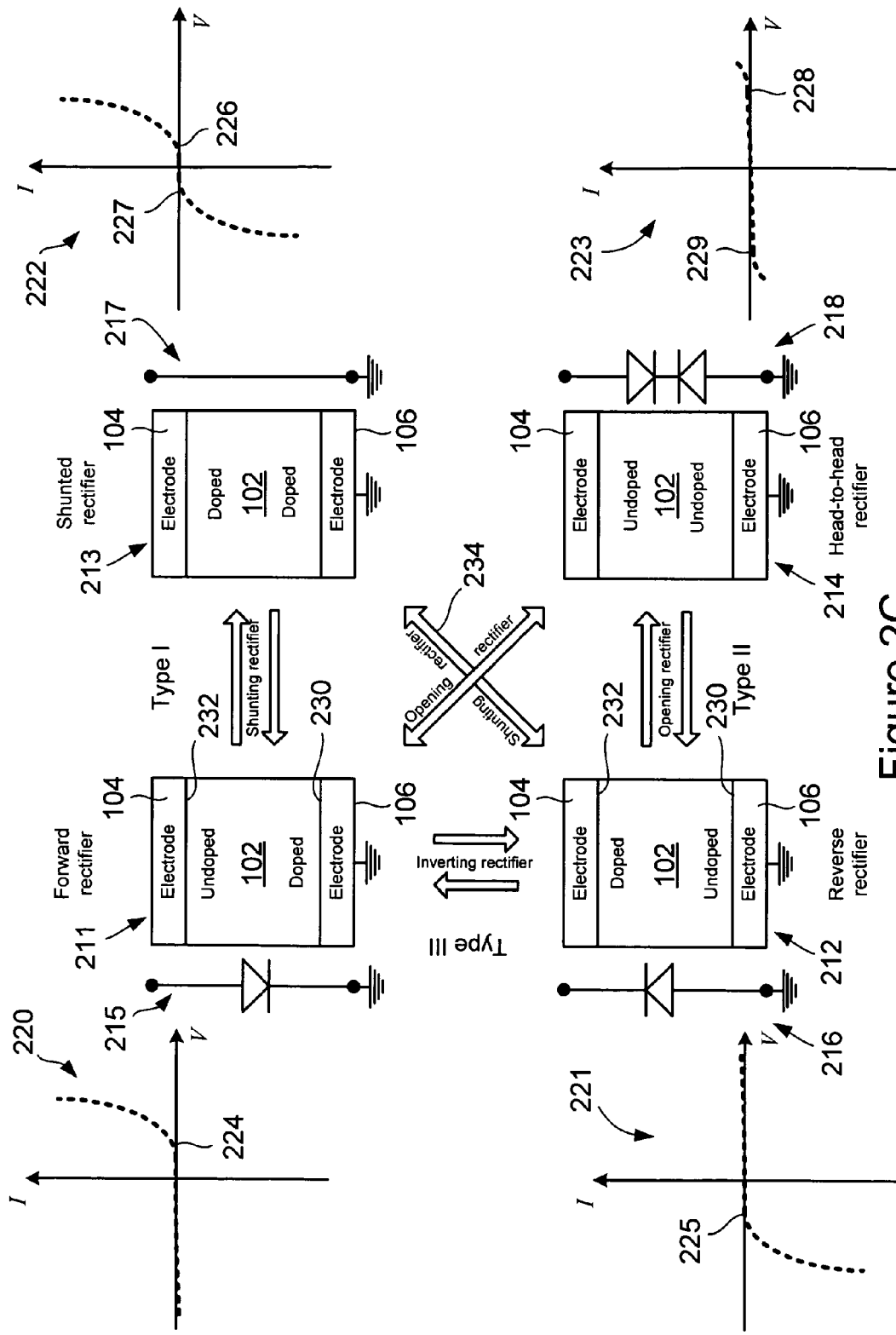
FIG. 2C shows plots of current-versus-voltage curves associated with the four rectifiers shown in FIG. 2B and three modes of switching between pairs of the rectifiers in accordance with embodiments of the present invention.

FIG. 2C shows schematic profiles of the four rectifiers 211-214 of the active region 102 and three modes of switching between pairs of rectifiers in accordance with embodiments of the present invention. In addition to the four rectifiers 211-214, FIG. 2C includes circuit diagrams 215-218 and I-V characteristic plots 220-223 that are associated with each of the four rectifiers 211-214. Each of the four rectifiers 211-214 of the device 100 represents a different profile distribution of dopants, and therefore, has a different associated I-V characteristic represented in each of the plots 220-223. Electrode/active region contacts are typically Ohmic-like in the case of heavy doping, and rectifying or Schottky-like in the case of low doping. Thus, the concentration of dopants at an interface determines the electronic behavior, and therefore, the transport of charge carriers through the active region 102. The four different rectifiers 211-214 are identified as a forward rectifier, a reverse rectifier, a shunted rectifier, and a head-to-head rectifier, respectively. The rectifying state properties of each of these rectifiers depend on the distribution of dopants within the active region 102.

The plots 220-223 of the I-V characteristic curves reveal the response of the device 100 to different operating voltage polarities and magnitudes. In particular, plot 220 reveals that when the device 100 is configured as the forward rectifier 211, current flows from the first electrode 104 to the second electrode for positive polarity voltages exceeding a voltage 224 and resistance is large for negative polarity voltages. Plot 221 reveals that when the device 100 is configured as the reverse rectifier 212, current flows from the second electrode 106 to the first electrode 104 for negative polarity voltages exceeding a voltage 225 and resistance is large for positive polarity voltages. Plot 222 reveals that when the device 100 is configured as the shunted rectifier 213, current substantially flows undisturbed through the device 100 for positive and negative polarity voltages with magnitudes exceeding voltages 226 and 227. Finally, plot 223 reveals that when the device 100 is configured as a head-to-head rectifier 214, the resistance of the device 100 is high for positive and negative polarity voltages between voltages 228 and 229. Note that plots 220-223 show only operating voltage ranges. In other words, the magnitudes of voltages applied to the rectifiers 211-214 represented in plots 220-223 are not large enough to change the rectifier to a different rectifier or destroy the device 100.

The dopants are mobile under an appropriate drift field because the active region 102 may only be a few nanometers thick. The reconfiguration of the dopant profiles due to the drift of dopants under a drift field leads to electrical switching between the four rectifiers. As shown in FIG. 2C, shunting is switching between the forward rectifier 211 and the shunted rectifier 213. In this switching, interface 230 is heavily doped and remains Ohmic-like with negligible changes during the electrical biasing. A bias with an appropriate polarity and magnitude on the first electrode 104 attracts a portion of the dopants to the interface 232, switching the device from the forward rectifier 211 to the shunted rectifier 213. A bias with an opposite polarity and approximately the same magnitude switches the shunted rectifier 213 back to the forward rectifier 211. Of course, the switching between the reverse rectifier 212 and the shunted rectifier 213 also belongs to this type of switching, indicated by diagonal arrow 234.

Opening is switching between the reverse rectifier 212 and the head-to-head rectifier 214. In this case, the undoped interface 230 remains unchanged and only the doped interface 232 is switched. The undoped interface contains few dopants and remains rectifying instead of Ohmic-like. A bias of an appropriate polarity and magnitude on the first electrode 104 forces dopants away from the interface 232 and switches the reverse rectifier 212 into the head-to-head rectifier 214, and vice versa. The switching between the forward rectifier 211 and the back-to-back rectifier 214 is also opening.

Inverting between the forward rectifier 211 and the reverse rectifier 212 involves simultaneously applying oppositely polarized biases to the electrodes 104 and 106. For example, switching from the forward rectifier 211 to the reverse rectifier 212 is accomplished by applying oppositely polarized biases to the electrodes 104 and 106 to force dopants away from the interface 230 and attract dopants to the interface 232. Switching from the reverse rectifier 212 to the forward rectifier 211 is accomplished by applying oppositely polarized biases to the electrodes 104 and 106 to force dopants away from the interface 232 and attract dopants to the interface 230. Therefore, the dopant profile across the active region 102 is essentially inverted and so is the rectifying orientation, resulting in a switching between a reverse rectifier and a forward rectifier.

III. Device Composition and Operation

The electrodes 104 and 106 can be composed of platinum, gold, silver, copper, or any other suitable metal, metallic compound (e.g. some perovskites such as $BaTiO_3$ and $Ba_{1-x}La_xTiO_3$, $PrCaMnO_3$) or semiconductor. The primary active material of the active region 102 can be composed of an oxide, and the second active material can be composed of a material that forms anion vacancies. The active region 102 can be composed of oxides that contain at least one oxygen atom ("O") and at least one other element. In particular, the active region 102 can be composed of titania ("$TiO_2$"), zirconia ("$ZrO_2$"), and hafnia ("$HfO_2$"). These materials are compatible with silicon ("Si") integrated circuit technology because they do not create doping in the Si. Other composition embodiments for the active region 102 include alloys of these oxides in pairs or with all three of the elements Ti, Zr, and Hf present. For example, the active region 102 can be composed of $Ti_xZr_yHf_zO_2$, where x+y+z=1. Related compounds include titanates, zirconates, and hafnates. For example, titanates includes $ATiO_3$, where A represents one of the divalent elements strontium ("Sr"), barium ("Ba") calcium ("Ca"), magnesium ("Mg"), zinc ("Zn"), and cadmium ("Cd"). In general, the active region 102 can be composed of $ABO_3$, where A represents a divalent element and B represents Ti, Zr, and Hf. The active region 102 can also be composed of alloys of these various compounds, such as $Ca_aSr_b$-$Ba_cTi_xZr_yHf_zO_3$, where a+b+c=1 and x+y+z=1. There are also a wide variety of other oxides of the transition and rare earth metals with different valences that may be used, both individually and as more complex compounds. In each case, the mobile dopant is an oxygen vacancy, denoted by $V_O$. An oxygen vacancy effectively acts as a positively charged n-type dopant with one shallow and one deep energy level. Because even a relatively minor nonstoichiometry of about 0.1% oxygen vacancies in $TiO_{2-x}$, is approximately equivalent to $5 \times 10^{19}$ dopants/cm$^3$, modulating oxygen vacancy profiles have strong effect on electron transport.

Figure 3:
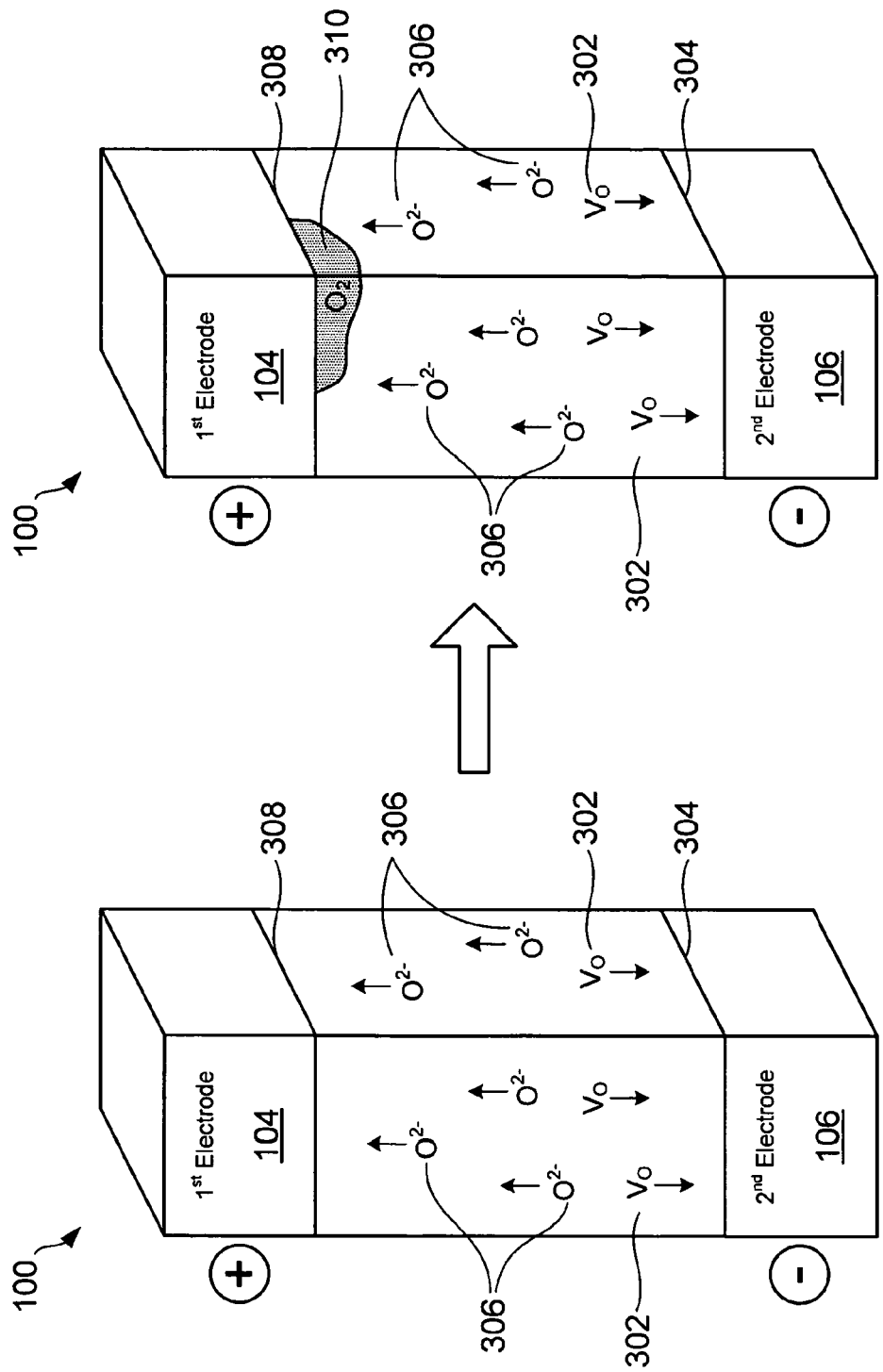
FIG. 3 shows oxygen bubble formation in an active region of a memristor device.

During formation of an oxide-based active region 102, oxygen ions may migrate and get reduced to oxygen ("$O_2$") at the interface between the active region 102 and one or both of the electrodes 104 and 106. As shown in FIG. 3, when a voltage is applied to the device 100 the associated electric field created across the active region 102 drives the oxygen vacancies $V_O$ 302 to the interface 304 between the active region 102 and the negatively biased second electrode 106 and drives oxygen anion ("$O^{2-}$") 306 to the interface 308 between the active region 102 and the positively biased first electrode 104. As the oxygen anion 306 collects at the interface 308, oxygen bubbles 310 form along the interface 308 between the active region 102 and the positively biased first electrode 104 as the results of the electro-reduction of the oxide. These oxygen bubbles are defects that adversely effect operation of the device 100. In particular, the bubbles can alter the desired resistance of the active region 102 and the ability to change the device 100 to a different rectifying state. The bubbles can also deform the device 100, or the bubbles can be released from the active region 102 into the surroundings depleting the active region 102 of oxygen and reducing the lifetime of the device 100.

Embodiments of the present invention include incorporating an oxygen storage or sink material within an active region. The oxygen storage material stores excess oxygen formed in the active region and prevents the formation of oxygen bubbles. The oxygen storage material can be distributed within the active region in a number of different ways. FIGS. 4A-4C show three ways in which an oxygen storage material can be incorporated into an active region 402 of a memristors device 400 in accordance with embodiments of the present invention. As shown in FIG. 4A, in certain embodiments, the oxygen storage material can be deposited as a single layer 404 between the first electrode 104 and the active region 402. In other embodiments, the active region can include additional layers of oxygen storage material deposited as intermediate layers anywhere within the active region 402. As shown in FIG. 4B, an additional layer 406 of oxygen storage material is deposited within the active region 402. The layer 406 can be deposited anywhere within the active region 402 or deposited at the interface between the active region 402 and the second electrode 106. In still other embodiments, the oxygen storage material can be dispersed throughout the active region 402 as particles. As shown in FIG. 4C, the oxygen storage material is incorporated within the active region 402 as particles 408. The oxygen storage material can be dispersed by co-deposition of the oxygen storage material along with deposition of the oxide material comprising the active region 402.

Figure 6:
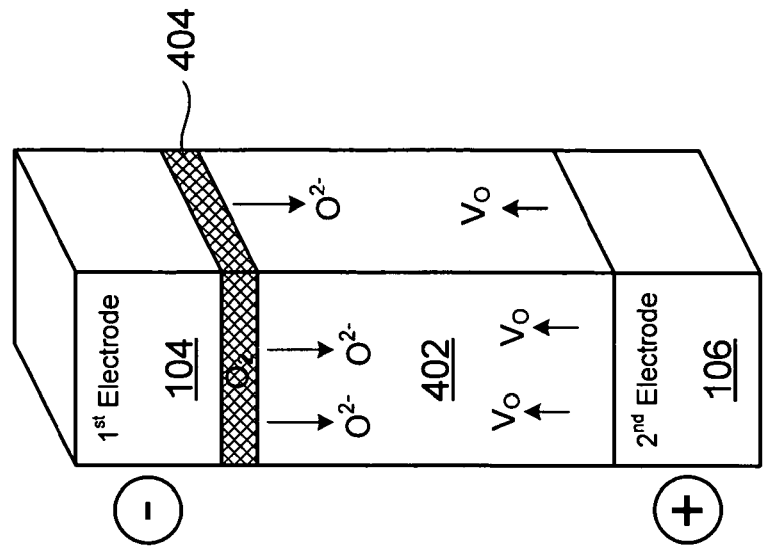
FIG. 6 shows introduction of oxide from an oxygen storage layer into the active region of the memristor device shown in FIG. 4A in accordance with embodiments of the present invention.
Figure 5:
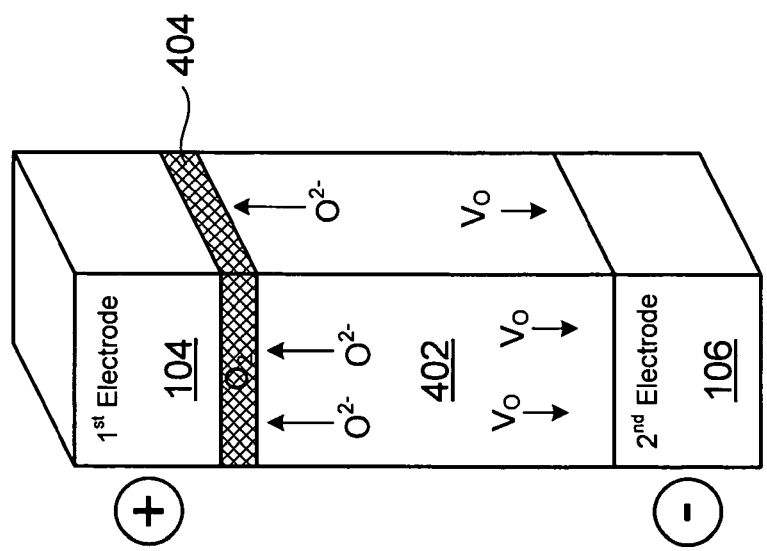
FIG. 5 shows extraction of oxide from the active region of the memristor device shown in FIG. 4A in accordance with embodiments of the present invention.

When a voltage of an appropriate magnitude and polarity is applied to the device 400, oxygen anions, such as $O^{2-}$, are driven toward the positively biased first electrode 104 and are trapped and stored within the oxygen storage materials. The oxygen anions can be stored within the storage material as molecular oxygen ("$O_2$") or other forms of oxygen depending on the composition of the oxygen storage material. FIG. 5 shows oxygen anion extraction from the active region 402 into the layer 404 of the device 400 shown in FIG. 4A in accordance with embodiments of the present invention. The electric field created by the voltage drives oxygen atoms toward the oxygen storage material layer 404 where the oxygen is stored as elemental oxygen. When a voltage of an appropriate magnitude and reverse polarity is applied to the device 400, the oxygen stored within the oxygen storage material is released from the oxygen storage material back into the active region 402 as oxide. FIG. 6 shows a reverse polarity voltage applied to the device 400 shown in FIG. 4A to drive oxygen out of the oxygen storage material layer 404 in accordance with embodiments of the present invention.

The concentration of oxygen vacancies can be controlled by varying the stoichiometry of oxygen within the active region 402. This can be accomplished by applying voltages of an appropriate magnitude and polarity in order to drive oxygen in and out of the oxygen storage material, as described above with reference to FIGS. 5 and 6.

The oxygen storage material can be composed of a suitable oxygen storage compound, such as zirconium oxide ("$ZrO_x$"), vanadium nitride ("$VN_x$"), titanium nitride ("$TiN_x$"), or tungsten nitride ("$WN_x$"). Other oxygen storage materials include cerium oxide, ("$CeO_x$"), lanthanum oxide ("$LaO_x$"), neodymium oxide ("$NdO_x$"), titanium oxide ("$TiO_x$"), vanadium oxide ("$VO_x$"), europium oxide ("$EuO_x$"), iridium oxide ("$IrO_x$"), molybdenum oxide ("$MoO_x$"), osmium oxide ("$OsO_x$"), ruthenium oxide ("$RuO_x$"), rhodium oxide ("$RhO_x$"), tungsten oxide ("$WO_x$"), and chromium oxide ("$CrO_x$").

In other embodiments, the oxygen storage material can also be composed of a material comprising a micro-porus molecular structure, where the pores are dimensioned to trap oxygen. For example, the oxygen storage material can be composed of a zeolite that traps oxide in the micro-scale pores of the zeolite crystal. In still other embodiments, the oxygen storage material can also be composed of other porous materials, such as materials used to form nano-tubular structures. The oxygen storage material can be composed of carbon nanotubes or inorganic nanotubes, such as alumina nanotubes.

IV. Nanowire Implementations

Figure 7:
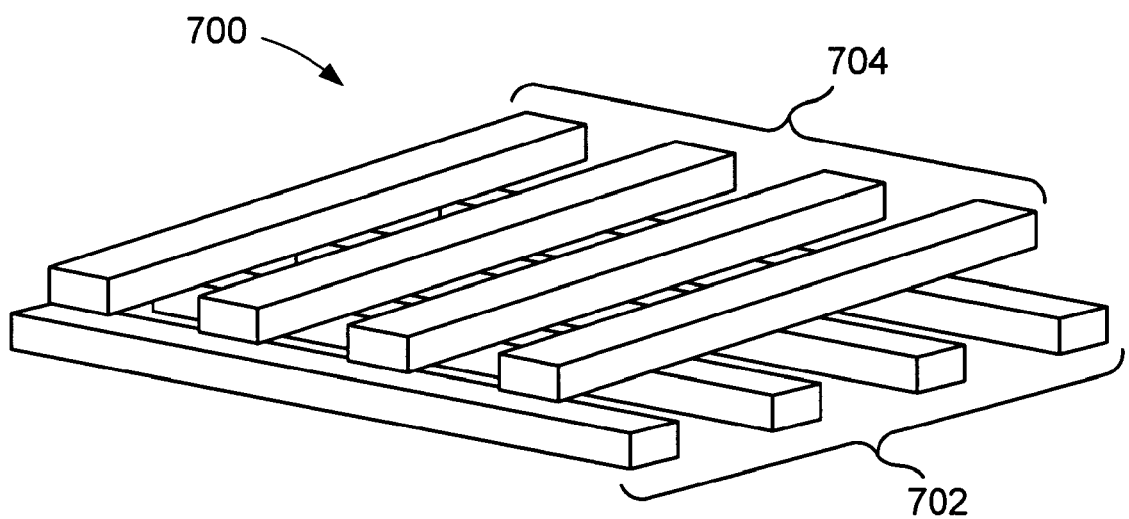
FIG. 7 shows an isometric view of a nanowire crossbar array configured in accordance with embodiments of the present invention.

The memristor device 400 can be implemented at nanowire intersections of nanowire crossbar arrays. FIG. 7 shows an isometric view of a nanowire crossbar array 700 configured in accordance with embodiments of the present invention. The crossbar array 700 is composed of a first layer of approximately parallel nanowires 702 that are overlain by a second layer of approximately parallel nanowires 704. The nanowires of the second layer 804 are approximately perpendicular, in orientation, to the nanowires of the first layer 702, although the orientation angle between the layers may vary. The two layers of nanowires form a lattice, or crossbar, each nanowire of the second layer 704 overlying all of the nanowires of the first layer 702 and coming into close contact with each nanowire of the first layer 702 at nanowire intersections that represent the closest contact between two nanowires.

Although individual nanowires in FIG. 7 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

The layers can be fabricated by mechanical nanoimprinting techniques. Alternatively, nanowires can be chemically synthesized and can be deposited as layers of approximately parallel nanowires in one or more processing steps, including Langmuir-Blodgett processes. Other alternative techniques for fabricating nanowires may also be employed. Thus, a two-layer nanowire crossbar comprising first and second layers, as shown in FIG. 7, can be manufactured by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits. At nanowire intersections, nanoscale electronic components, such as resistors, and other familiar basic electronic components, can be fabricated to interconnect two overlapping nanowires. Any two nanowires connected by a device is called a "crossbar junction."

Figure 8:
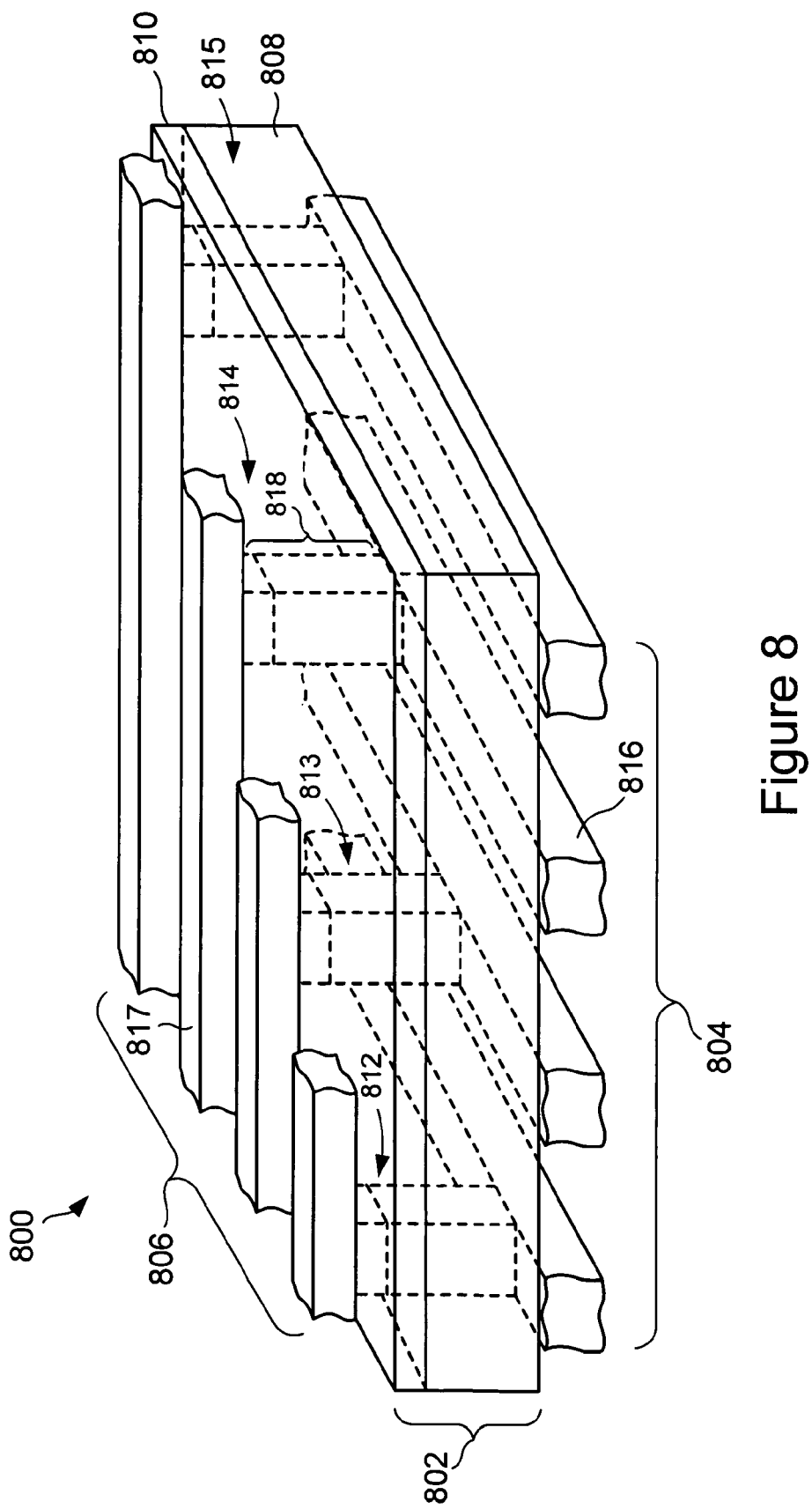
FIG. 8 shows an isometric view of a nanowire crossbar revealing devices located at intersection of a crossbar configured in accordance with embodiments of the present invention.

FIG. 8 shows an isometric view of a nanowire crossbar 800 revealing an intermediate layer 802 disposed between a first layer of approximately parallel nanowires 804 and a second layer of approximately parallel nanowires 806 in accordance with embodiments of the present invention. The layer 802 is composed of sub-layers 808 and 810. The sub-layer 808 can be composed of an undoped primary active material, and the sub-layer 810 can be composed of a doped secondary active material, respectively. The material comprising the layer 802 and dopants are selected as described in subsection III to form devices 812-815 at each nanowire intersection. In particular, the layer 802 can include an oxygen storage material distributed within the devices 812-815, as described above with reference to FIG. 4. The nanowires can be composed of suitable metal of semiconductor materials and serve as electrodes. For example, sub-layer 808 can be composed of $TiO_2$, relatively thinner sub-layer 810 can be composed of $TiO_{2-x}$, where oxygen vacancies in the sub-layer 810 are dopants, and the nanowires can be composed of Pt, the layer 810 can include an oxygen storage material distributed within the layer 802, as described above with reference to FIG. 4. The device 814 is formed by a nanowire 816 in the first layer 804, a nanowire 817 in the second layer 806, and a region 818 within the layer 802 between the nanowires 816 and 817. Each of the devices 812-815 can be operated separately to produce the forward, reverse, shunted, and head-to-head rectifiers described above with reference to FIG. 2.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A device comprising:
   an active region configured to control the flow of charge carriers between a first electrode and a second electrode, the active region being disposed between the first electrode and the second electrode and comprising a plurality of oxygen storage material regions,
   wherein mobile dopant anions associated with the plurality of oxygen storage material regions formed within the active region migrate from the active region and are trapped and stored in the plurality of oxygen storage material regions in response to applying a first voltage at the first electrode relative to the second electrode, and
   wherein the mobile dopant anions are released from the plurality of oxygen storage material regions and migrate to the active region in response to a second voltage at the first electrode relative to the second electrode that is opposite in polarity of the first voltage.

2. The device of claim 1 wherein the device resistance can be re-configured to by positioning the mobile dopant anions and dopant vacancies within the active region in response to the first and second voltages.

3. The device of claim 2 wherein positioning the dopant vacancies further comprises positioning the dopant vacancies near an electrode/active region interface making the interface Ohmic-like and positioning the dopant vacancies away from the electrode/active region interface making the interface Schottky-like.

4. The device of claim 1 wherein the plurality of oxygen storage material regions comprises a layer interconnecting the first electrode and the active region.

5. The device of claim 1 wherein a material of each of the plurality of oxygen storage material regions is selected from a group consisting of: zirconium oxide, vanadium nitride, titanium nitride, or tungsten nitride, cerium oxide, lanthanum oxide, neodymium oxide, titanium oxide, vanadium oxide, europium oxide, iridium oxide, molybdenum oxide, osmium oxide, ruthenium oxide, rhodium oxide, tungsten oxide, and chromium oxide, a carbon nanotube, and an inorganic nanotube.

6. A device comprising:
   an undoped primary active region comprising at least one material for transporting mobile dopant anions and dopant vacancies that controls a flow of charge carriers through the device between a first electrode and a second electrode;
   a doped secondary active region comprising at least one material for providing a source/sink of the mobile dopant anions and the dopant vacancies for the at least one primary active region; and
   a plurality of storage material regions, wherein the mobile dopant anions associated with the plurality of storage material regions formed within the doped secondary active region migrate from the doped secondary active region via the undoped primary active region and are trapped and stored in the plurality of storage material regions in response to applying a first voltage at the first electrode relative to the second electrode, and the mobile dopant anions are released from the plurality of storage material regions and migrate to the doped secondary active region via the undoped primary active region in response to a second voltage at the first electrode relative to the second electrode that is opposite in polarity of the first voltage.

7. The device of claim 6 wherein the undoped primary active region further comprises a material that is electronically semiconducting, nominally electronically insulating, or weakly ionic conducting.

8. The device of claim 6 wherein the undoped primary active region further comprises a film having an electrical conductivity that is capable of being reversibly changed from a relatively low conductivity to a relatively high conductivity as a function of the mobile dopant anions and the dopant vacancies drifting into or out of the undoped primary active region.

9. The device of claim 6 wherein the at least one material for the undoped, primary active region and the material for the doped secondary active region are selected from the group consisting of: titanates, zirconates, hafnates, lanthanates, manganites, other suitable alloys of these oxides in pairs or with oxides present together, and compounds of the type $A^{++}B^{4+}O_3^{--}$, where A represents at least one divalent element and B represents at least one of titanium, zirconium, and hafnium.

10. The device of claim 6 wherein the at least one material for the undoped primary active region and the material for the doped secondary active region are selected from the following list:
    $TiO_2/TiO_{2-x}$;
    $ZrO_2/ZrO_{2-x}$;
    $HfO_2/HfO_{2-x}$; and
    $SrTiO_3/SrTiO_{3-x}$;
    where x corresponds to a positive real number concentration of oxygen in the plurality of storage material regions and is less than a whole number stoichiometric molar fraction of oxygen in the material for the doped secondary active region.

11. A crossbar comprising:
    a first layer of substantially parallel nanowires;
    a second layer substantially parallel nanowires overlaying the first layer of nanowires; and
    at least one nanowire intersection forming an electronic device configured in accordance with claim 1.

12. The crossbar of claim 11 wherein any two overlapping nanowires in the first and second layers form an electronic device configured in accordance with claim 1.

13. The device of claim 1, wherein the plurality of oxygen storage material regions is arranged as a first oxygen storage material layer, the device further comprising a second oxygen storage material layer separated from the first oxygen storage material layer by at least a portion of the active region.

14. The device of claim 8, wherein the film comprises a source that provides the mobile dopant anions.

15. The device of claim 1, wherein the oxygen storage material comprises a micro-porous molecular structure configured to trap the mobile dopant anions configured as oxygen anions.

16. The device of claim 1, wherein the plurality of oxygen storage material regions comprises a zeolite material.

17. The device of claim 1, wherein the plurality of oxygen storage material regions are interspersed throughout the active region.

* * * * *

UNITED STATES PATENT AND TRADEMARK OFFICE
CERTIFICATE OF CORRECTION

PATENT NO.        : 9,000,411 B2
APPLICATION NO.   : 13/130799
DATED             : April 7, 2015
INVENTOR(S)       : Zhiyong Li et al.

Page 1 of 1

It is certified that error appears in the above-identified patent and that said Letters Patent is hereby corrected as shown below:

In the Claims

In column 12, line 19 approx., in Claim 9, delete "undoped," and insert -- undoped --, therefor.

Signed and Sealed this
Twenty-ninth Day of September, 2015

Michelle K. Lee
*Director of the United States Patent and Trademark Office*